(12) United States Patent
Bronkhorst et al.

(10) Patent No.: US 9,866,062 B2
(45) Date of Patent: Jan. 9, 2018

(54) ELECTRICAL DEVICE

(71) Applicant: Technetix B.V., Veenendaal (NL)

(72) Inventors: Gert Bronkhorst, Ede (NL); Jan Ariesen, Veenendaal (NL)

(73) Assignee: Technetix B.V., Veenendaal (NL)

( * ) Notice: Subject to any disclaimer, the term of this patent is extended or adjusted under 35 U.S.C. 154(b) by 370 days.

(21) Appl. No.: 14/761,158

(22) PCT Filed: Jan. 17, 2014

(86) PCT No.: PCT/EP2014/050888
§ 371 (c)(1),
(2) Date: Jul. 15, 2015

(87) PCT Pub. No.: WO2014/114562
PCT Pub. Date: Jul. 31, 2014

(65) Prior Publication Data
US 2015/0333567 A1    Nov. 19, 2015

(30) Foreign Application Priority Data

Jan. 25, 2013  (GB) .................................. 1301351.1

(51) Int. Cl.
| H02J 9/00 | (2006.01) |
| H02J 9/06 | (2006.01) |
| H03F 3/19 | (2006.01) |
| H02J 11/00 | (2006.01) |
| H04N 7/10 | (2006.01) |

(52) U.S. Cl.
CPC .................. *H02J 9/06* (2013.01); *H02J 11/00* (2013.01); *H03F 3/19* (2013.01); *H04N 7/102* (2013.01); *H03F 2200/451* (2013.01)

(58) Field of Classification Search
CPC ......... H04N 21/4436; H02N 5/63; H02J 9/06; H02J 11/00; H02J 7/0013; G06F 1/1632
See application file for complete search history.

(56) References Cited

U.S. PATENT DOCUMENTS

| 5,136,229 A | 8/1992 | Galvin |
| 5,200,685 A * | 4/1993 | Sakamoto ............... G06F 1/263 307/66 |

(Continued)

OTHER PUBLICATIONS

Search Report issued in connection with United Kingdom Patent Application No. GB 1301351.1, 1 page, United Kingdom Intellectual Property Office, dated Jul. 23, 2013.

*Primary Examiner* — Rexford Barnie
*Assistant Examiner* — Rasem Mourad
(74) *Attorney, Agent, or Firm* — Dascenzo Intellectual Property Law, P.C.

(57) ABSTRACT

There is provided an electrical device (10) comprising electrical elements communicating with an integral power supply (12), wherein a power connection means (22) associated with the electrical elements (13, 13' and 14) is adapted to receive a temporary external source of electrical power such as a battery (24) to allow removal and replacement of the integral power supply without interrupting power to the electrical elements. The integral power supply (12) is adapted to receive an enduring external power source, with a second switch (32) provided to disable connection of the integral power supply (12) to the enduring power source while the battery (24) is connected.

8 Claims, 5 Drawing Sheets

(56) References Cited

U.S. PATENT DOCUMENTS

| | | | |
|---|---|---|---|
| 5,656,869 A | 8/1997 | Gluskoter et al. | |
| 6,904,530 B2* | 6/2005 | Frank | G06F 1/263 710/2 |
| 7,402,981 B2* | 7/2008 | May | H02J 7/0065 320/137 |
| 7,545,118 B2* | 6/2009 | Kim | G06F 1/26 320/128 |
| 8,604,752 B2* | 12/2013 | Cole, Jr. | H01M 2/1022 320/114 |
| 2002/0011823 A1* | 1/2002 | Lee | G06F 1/1632 320/137 |
| 2004/0105034 A1* | 6/2004 | Libera | H02J 9/005 348/730 |
| 2006/0146581 A1 | 7/2006 | Murphy | |
| 2010/0187908 A1 | 7/2010 | Okano et al. | |
| 2010/0301675 A1* | 12/2010 | Chen | H02J 9/005 307/66 |
| 2011/0141708 A1 | 6/2011 | Sip et al. | |
| 2012/0080954 A1 | 4/2012 | Gachon et al. | |
| 2012/0188463 A1* | 7/2012 | Deshpande | H04N 5/63 348/730 |
| 2012/0218684 A1* | 8/2012 | Andersen | H02J 9/04 361/601 |

\* cited by examiner

ELECTRICAL DEVICE

FIELD OF THE INVENTION

This invention relates to an electrical device with an internal power supply, and in particular to such electrical devices used in cable television and broadband networks.

BACKGROUND TO THE INVENTION

Electrical devices often have integral power supplies which can be at least partially powered by an external power source, for example mains electricity in the case of a laptop computer. If the integral power supply fails, the device stops operating. This is a particular problem in cable television (CATV) and broadband networks where many active devices with integral power supplies are used, such as optical nodes, amplifiers and the like, and all signals going to and from customers subscribing to the network are routed via these devices.

If the integral power supply of any one of the CATV active devices fails, the network connection and service to the subscriber also fail. The integral power supplies are typically designed with the use of electrolytic capacitors which have a low "Mean Time Between Failures" (MTBF) compared to all other components used in the active devices. Thus the integral power supply is likely to fail before other components fail.

When the active device fails, there is always a signal interruption for the customer during the replacement. Analogue/digital TV, triple play Internet and video on demand services routed through the CATV network are temporarily unavailable until a technician has finished the replacement and configuration of the active device. It is very important to have a network that can be updated and configured without the customers' cable service being interrupted.

SUMMARY OF THE INVENTION

In accordance with the present invention, there is provided an electrical device comprising electrical elements, such as components in a circuit, powered by an integral power supply, wherein a power connection associated with the electrical elements is adapted to receive a temporary source of electrical power during removal and replacement of the integral power supply, the enduring external power source and the power connection connected to a common switch, the common switch moveable between a first position to connect the enduring external power source to the integral power supply and a second position to disconnect the integral power supply from the enduring external power source, the first and second positions being mutually exclusive and wherein the common switch is arranged to automatically switch to the second position on detecting connection of a temporary external source of electrical power to the power connection and to revert to the first position on detecting removal of the temporary external source of electrical power, such as a battery or temporary alternating current power supply, thereby to maintain power during removal and replacement of the integral power supply. The enduring external power source may be provided by mains electricity, a generator or from coaxial cable, with such an enduring source provided for typically periods of days to years. When the integral power supply needs to be replaced, for example as part of routine maintenance or due to failure, electrical elements requiring power can still be powered and kept operational whilst replacement of the integral power supply takes place. By having a power connection for a temporary external power source that is typically used for periods of less than 30 minutes, a backup power source within the device does not need to be provided, so saving on space and electrical connections within the device.

This enables the connection between the enduring external power supply and integral power supply to be disabled, allowing the integral power supply to be safely moved without fear of electrical shock during replacement.

Typically the integral power supply will be contained within the same housing as the electrical elements.

A diode may be disposed in an electrical path between the electrical elements and the power connection.

If desired, the power connection may be connected to one electrical element requiring power to operate, such as an amplifier unit.

The integral power supply may be associated with an isolating power connector for safe removal of the integral power supply.

Preferably the integral power supply and power connection are connected to a common second switch, the common second switch moveable between a first position to connect the electrical elements to the integral power supply and a second position to connect the electrical elements to the power connection, the first and second positions being mutually exclusive. Thus the common second switch disables the connection between the electrical elements and the integral power supply and instead substitutes a connection between the temporary power supply and electrical elements.

The common second switch may be arranged to automatically switch to the second position on detecting connection of a temporary external source of electrical power to the power connection and to revert to the first position on detecting removal of the temporary external source of electrical power.

By switching the electrical components to be powered by the temporary external supply, the integral power supply is hot swappable and can be replaced while power to the electrical elements is maintained. The device can thus remain operational during replacement of the integral power supply.

The electrical device may be a device used as active outdoor CATV equipment, such as a CATV amplifier.

BRIEF DESCRIPTION OF THE DRAWINGS

The invention will now be described by way of example, and with reference to the following drawings in which.

DESCRIPTION

Figure 1:
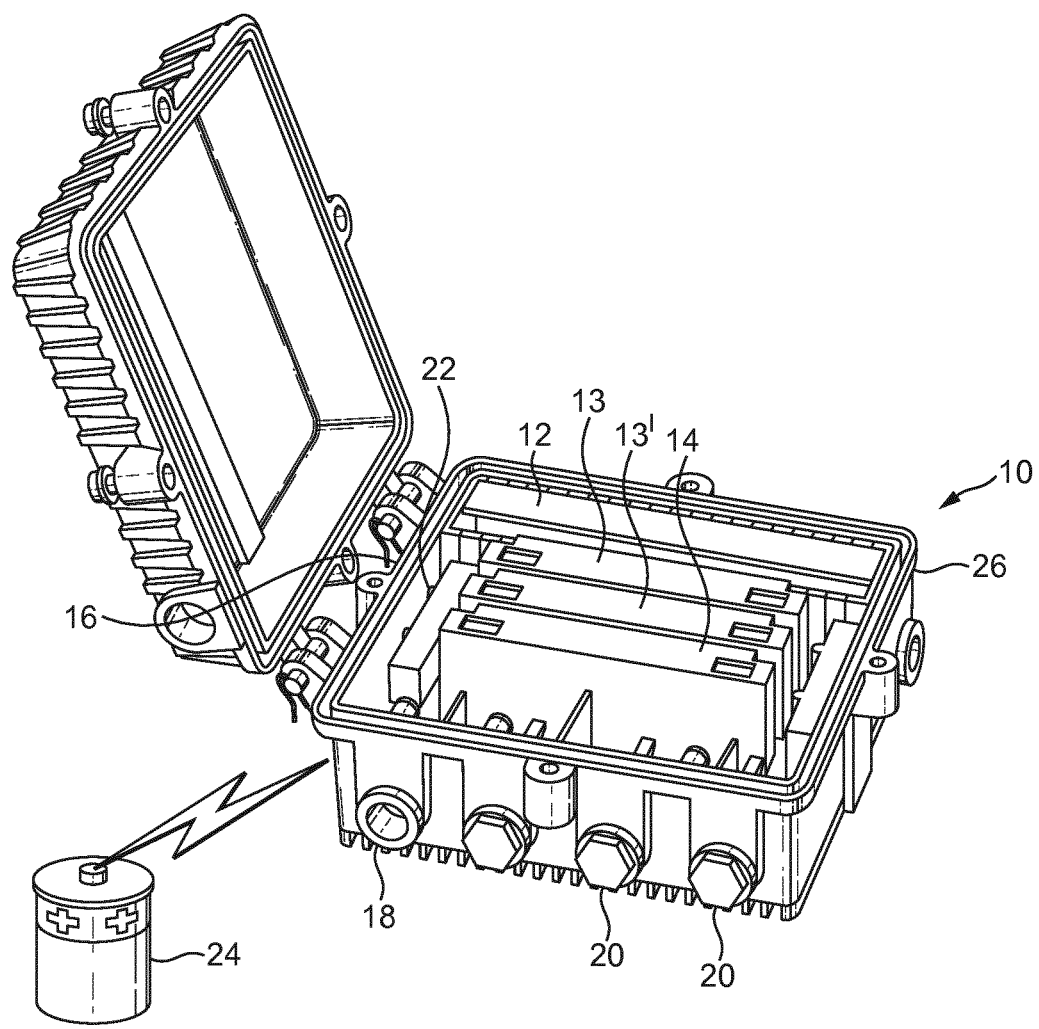
FIG. 1 is a perspective view of an amplifier in accordance with the present invention.

An electrical device 10 having an internal integral power supply 12, is shown in FIG. 1. The device can be any type of electrical device with an integral power supply but the example shown in FIG. 1 is a CATV amplifier for outdoor use which includes electrical core components 13, 13' for signal processing and amplifier unit 14 configured to amplify r.f. signals routed through the device. In this example, power supply 12 is arranged to modify an enduring external power supply, such as provided by mains electricity or coaxial cable, into suitable voltage and current characteristics for powering components within the device. The external power can be supplied through external input port 16 which supplies A.C. power at 230V to power supply 12 or through r.f. input port 18 where power at 36 to 60 VAC is taken from a coaxial cable also carrying an r.f. signal to be amplified.

The particular device shown splits and amplifies the incoming signal received at port 18 with the amplified r.f. signal transmitted through two output ports 20. An additional external input port 22 is also provided, this additional port 22 adapted with a battery connector to receive a temporary external power source such as battery 24. When power supply 12 needs replacing, temporary external power source 24 is connected to port 22 to ensure a continuous source of power whilst power supply 12 is replaced. This avoids failure of the device when the internal power supply 12 needs to be removed. In usual operation, electrical components 13, 13' and 14 are powered by internal power supply 12 while housing 26 is sealed shut.

Figure 2:
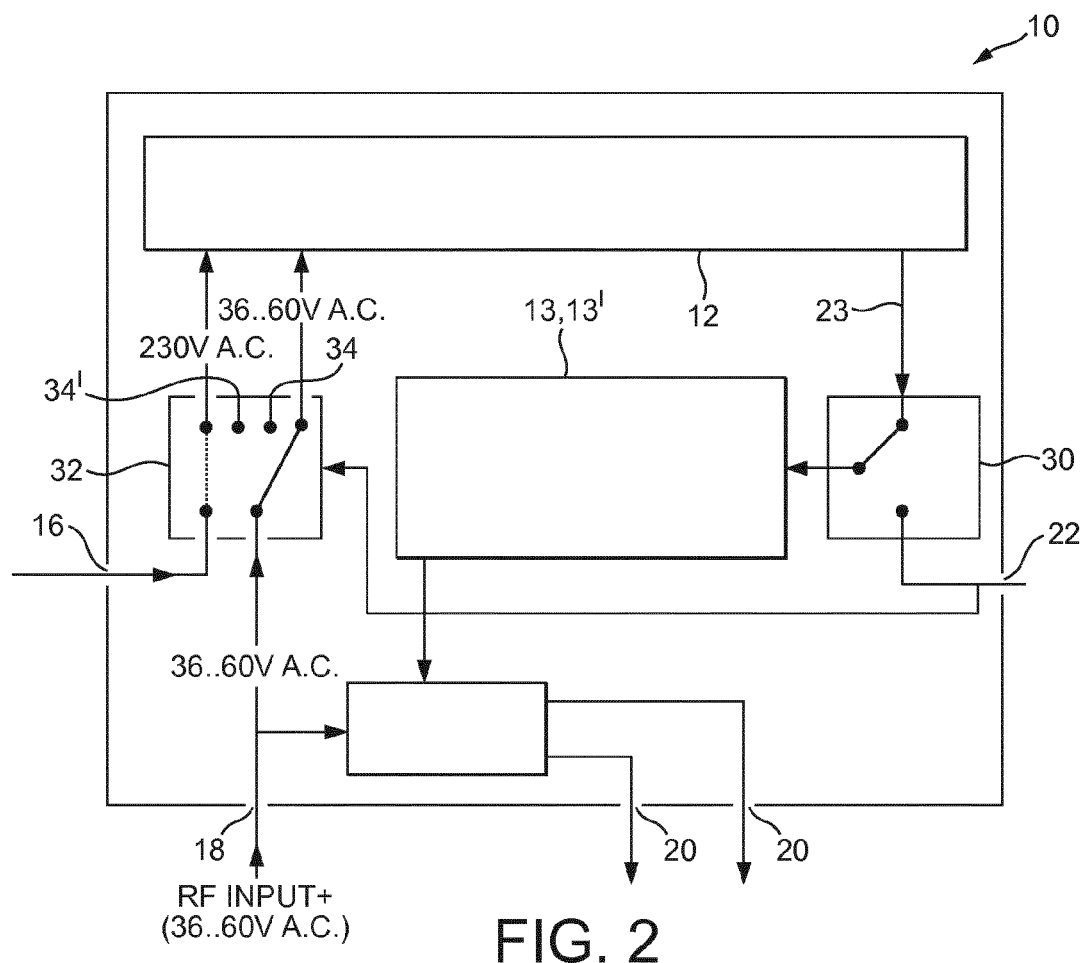
FIGS. 2 and 3 are schematic circuit diagrams of the amplifier.
Figure 3:
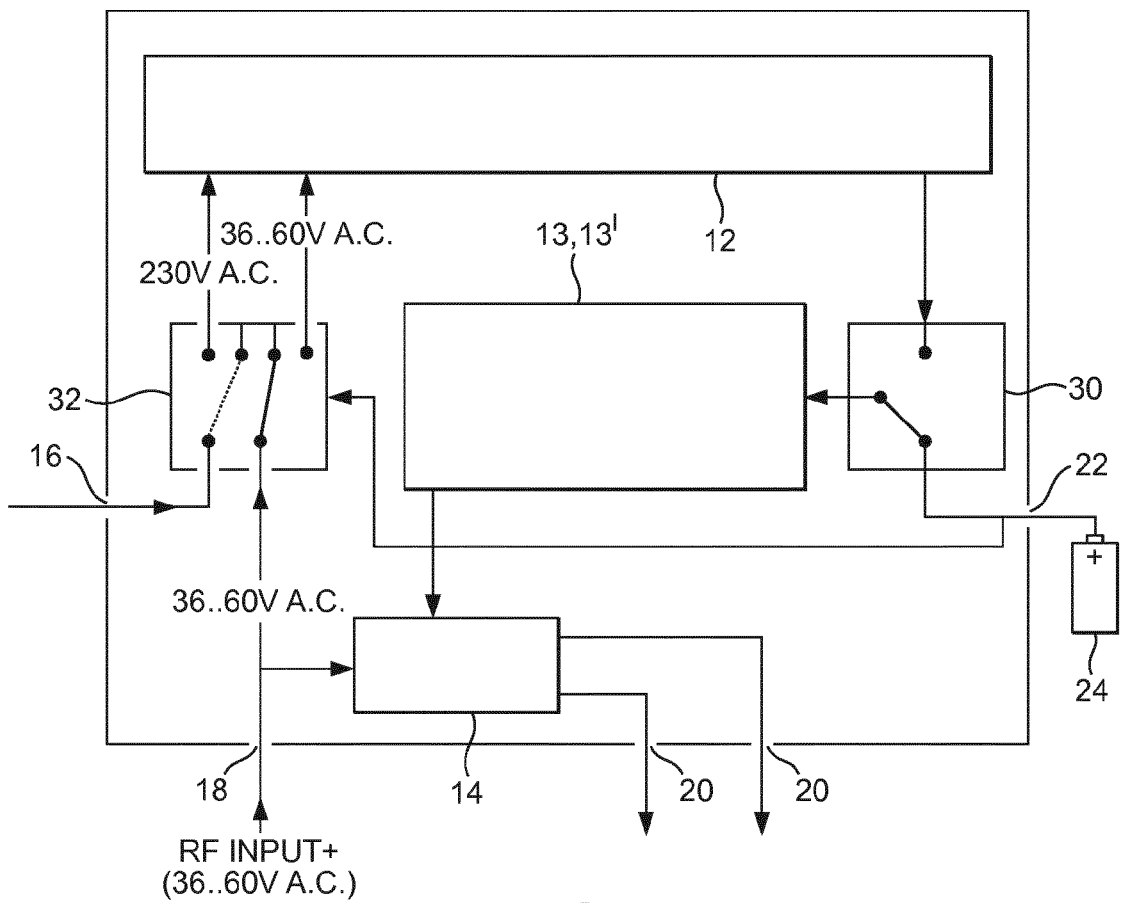

The electrical arrangement within device 10 is shown in schematic circuit diagrams of FIGS. 2 and 3. Electrical paths from power supply 12 and temporary power input port 22 are routed through switch 30, with switch 30 providing either a connection between power supply 12 and components 13, 13' or a connection between port 22 and components 13, 13'. When power supply 12 is operational, and no temporary external power source is connected to port 22, switch 30 occupies a normal, or rest, position as shown in FIG. 2 ensuring electrical communication between power source 12 and the remaining components of device 10.

When power supply 12 is to be replaced, battery 24 is connected to port 22. Switch 30 automatically detects the external power source and switches as shown in FIG. 3 to ensure power to the electrical components is then supplied from battery 24. Instead of battery 24, an external alternating current power supply can be used as the temporary power source.

To ensure internal power supply 12 can be safely removed, a second switch 32 is provided also responsive to connection of battery 24 at port 22 to interrupt the path between an external power supply and internal power supply 12 and switch the contacts to a neutral, or safe, position 34 or 34'. The external power can be provided by an enduring external power supply through port 16, typically at 230V A.C. or can be supplied from a coaxial cable also supplying the r.f. signal to be amplified and connected to device 10 at port 18. Both options are shown in FIGS. 2 and 3 although it is to be understood that only one source of external power is needed for internal power supply 12.

When power supply 12 is to be replaced, an external power supply, namely battery 24, is connected to port 22, usually for 2 to 30 minutes, and switch 30 automatically detects the connection of the temporary external power supply 24, operating to break the connection between internal power supply 12 and components 13, 13' and establish an electrical connection between the temporary external supply 24 and components 13, 13', 14 so as to maintain the power supply.

On connection of temporary power supply 24, switch 32 is also activated, switching to a neutral position 34 for an external power supply through port 16, or position 34' for an external power supply through port 18, and interrupting the permanent external power supply to power supply 12.

Figure 5:
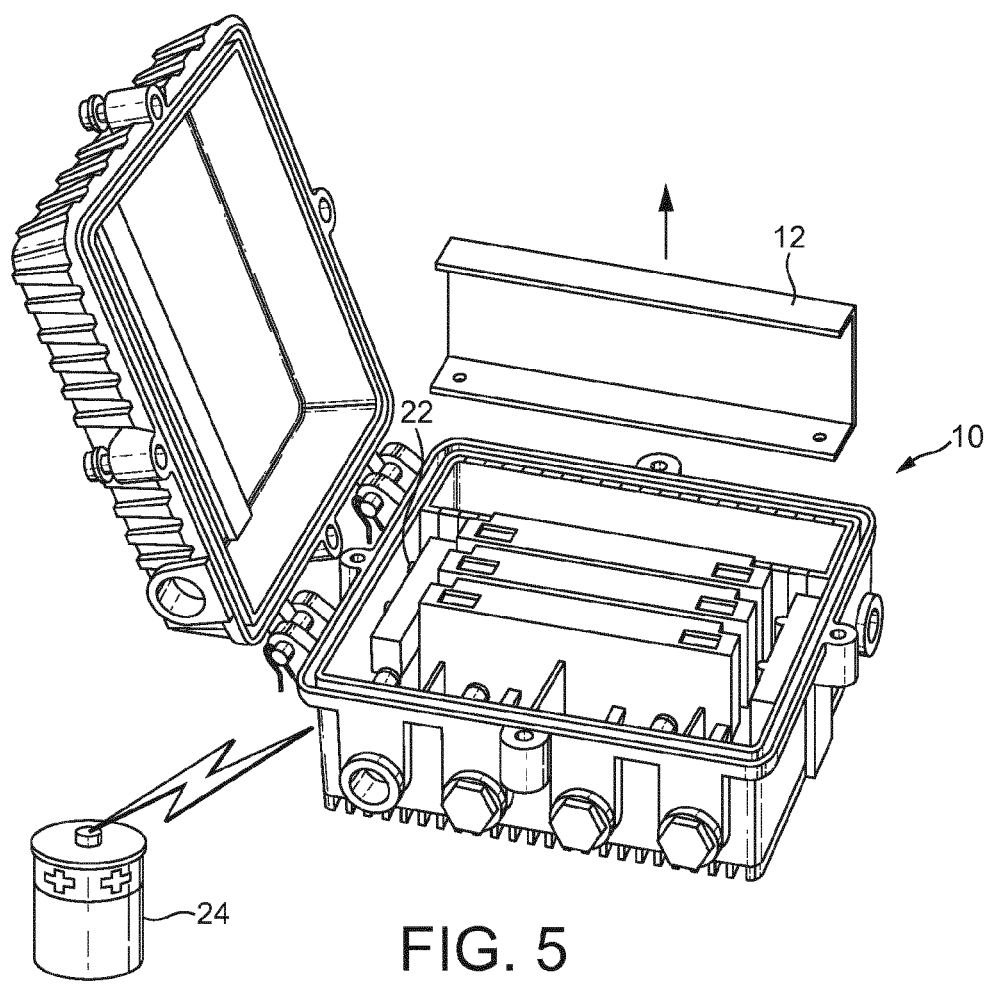
FIG. 5 is a perspective view showing removal of an integral power supply from the amplifier.

The old power supply 12 is able to be safely disconnected and removed, see FIG. 5, without any interruption to signal processing within device 10 as power to components 13, 13' and 14 is maintained. The device can thus remain operational even during replacement of the integral power supply. A new internal power supply is connected within housing 26, the housing sealed once again and external battery 24 removed. Upon removal of battery 24, switches 30, 32 revert to their original positions as shown in FIG. 2 restoring the connection between integral power supply 12 and the electrical components.

Figure 4:
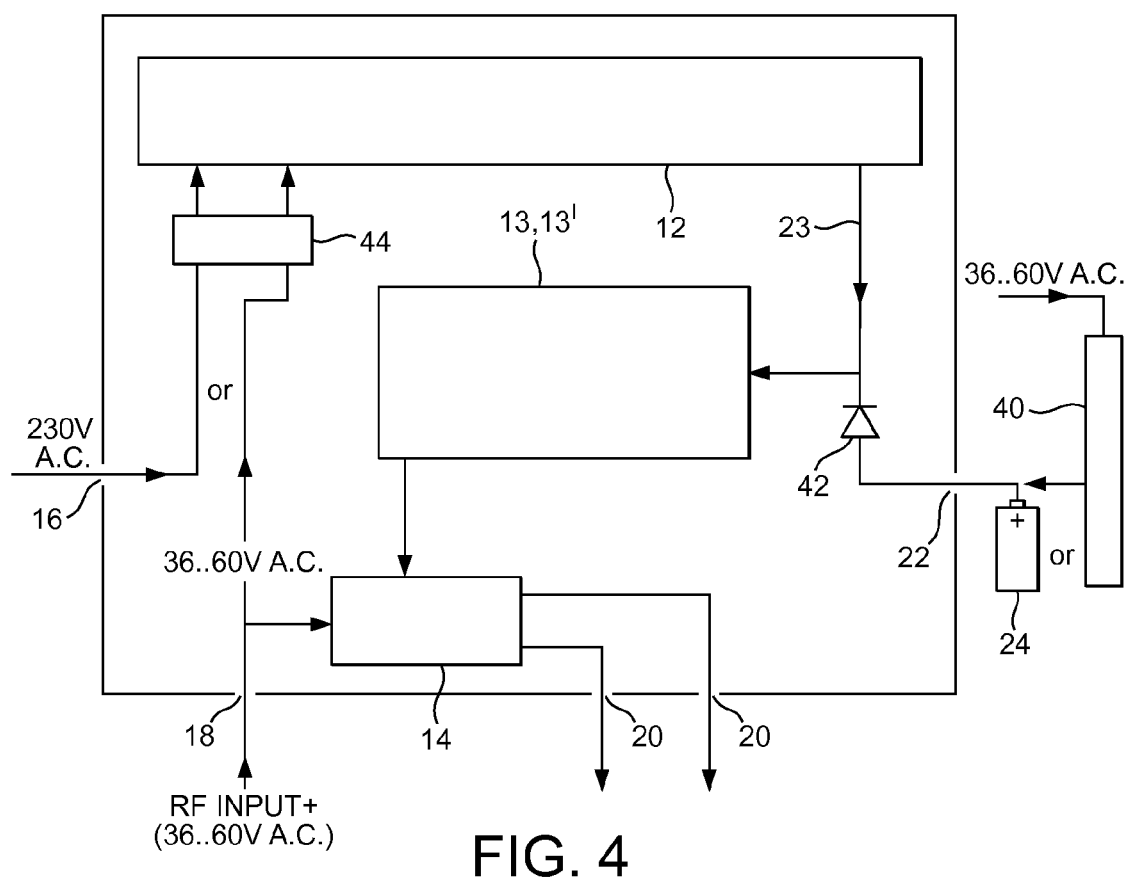
FIG. 4 is an alternate embodiment of the invention.

An alternative embodiment of the present invention is shown in FIG. 4 where a simplified circuit is used. Battery 24 or a temporary external alternating current power supply 40, typically between 36 to 60 VAC, are connectable via port 22 to output 23 of internal power supply 12 and so direct to analog/digital product core 13, 13'. Diode 42 is used to ensure the DC output from power supply 12 cannot travel along this alternative power input path and damage the external alternative power supply. As with FIG. 2, the external power can be supplied through external input port 16 which supplies A.C. power at 230V to power supply 12 or through r.f. input port 18 where power at 36 to 60 VAC is taken from a coaxial cable also carrying an r.f. signal to be amplified. Power supply 12 connects to an enduring external power supply by way of an isolated power connector 44 which immediately terminates any input power to power supply 12 when power supply 12 is removed. This ensures the power supply can be safely removed and avoids the need for second switch 32 as shown in FIG. 2. Thus when battery 24 or power supply 40 is connected, a parallel power source is provided which avoids a power drop when power supply 12 is removed for replacement and ensures the device remains operational. If desired, the external temporary battery 24 can be connected directly to the DC output circuit of internal power supply 12. The temporary external AC supply 40 can be connected to the amplifier circuit 14 to create a DC voltage to power up amplifier 14 together with digital core 13, 13'.

By having an external power supply and switching the electrical components from the power supplied by the integral power supply to a power supplied by the temporary external supply, the integral power supply is hot swappable and can be replaced while power to the electrical elements is maintained. The present invention allows an integral power supply to be replaced whilst an amplifier or other device is in situ in the field without the active device ceasing to operate, and thus customer services being interrupted. Upon removal of the temporary power supply, the new internal power supply is automatically restored without any interruption to device functionality, so avoiding any failure of the device.

The invention claimed is:

1. A CATV amplifier device comprising electrical elements powered by an integral power supply adapted to receive an enduring external power source, wherein a power connection associated with the electrical elements is adapted to receive a temporary source of electrical power during removal and replacement of the integral power supply, the enduring external power source and the power connection connected to a common switch, the common switch moveable between a first position to connect the enduring external power source to the integral power supply and a second position to disconnect the integral power supply from the enduring external power source, the first and second positions being mutually exclusive and wherein the common switch is arranged to automatically switch to the second position on detecting connection of a temporary external source of electrical power to the power connection and to revert to the first position on detecting removal of the temporary external source of electrical power.

2. The CATV amplifier device according to claim 1, wherein a diode is disposed in an electrical path between the electrical elements and the power connection.

3. The CATV amplifier device according to claim 1, wherein the power connection is connected to an amplifier unit.

4. The CATV amplifier device according to claim 1, wherein the integral power supply is associated with an isolating power connector.

5. The CATV amplifier device according to claim 1, wherein the integral power supply and power connection are connected to a common second switch, the common second switch moveable between a first position to connect the electrical elements to the integral power supply and a second position to connect the electrical elements to the power connection, the first and second positions being mutually exclusive.

6. The CATV amplifier device according to claim 5, wherein the common second switch is arranged to automatically switch to the second position on detecting connection of a temporary external source of electrical power to the power connection and to revert to the first position on detecting removal of the temporary external source of electrical power.

7. The CATV amplifier device according to claim 1, wherein the power connection is adapted to receive a battery.

8. The CATV amplifier device according to claim 1, wherein the power connection is adapted to receive an alternating current power source.

* * * * *